US009341951B2

(12) United States Patent
Hawryluk

(10) Patent No.: US 9,341,951 B2
(45) Date of Patent: May 17, 2016

(54) WYNN-DYSON IMAGING SYSTEM WITH REDUCED THERMAL DISTORTION

(71) Applicant: Andrew M. Hawryluk, Los Altos, CA (US)

(72) Inventor: Andrew M. Hawryluk, Los Altos, CA (US)

(73) Assignee: Ultratech, Inc., San Jose, CA (US)

( * ) Notice: Subject to any disclaimer, the term of this patent is extended or adjusted under 35 U.S.C. 154(b) by 589 days.

(21) Appl. No.: 13/723,260

(22) Filed: Dec. 21, 2012

(65) Prior Publication Data

US 2014/0176923 A1    Jun. 26, 2014

(51) Int. Cl.
| G02B 5/20 | (2006.01) |
| F21V 9/06 | (2006.01) |
| G03F 7/20 | (2006.01) |

(52) U.S. Cl.
CPC .......... *G03F 7/2002* (2013.01); *G03F 7/70191* (2013.01)

(58) Field of Classification Search
CPC ........ G02B 13/00; G02B 13/16; G02B 17/08; G02B 17/086; G02B 17/0808
USPC ......... 359/649–651, 726–728, 730, 733, 737, 359/798; 353/81–82, 97–99, 53; 355/53, 355/67, 71
See application file for complete search history.

(56) References Cited

U.S. PATENT DOCUMENTS

| 4,103,989 A | 8/1978 | Rosin |
| 4,171,870 A | 10/1979 | Bruning et al. |
| 4,391,494 A | 7/1983 | Hershel |
| 4,425,037 A | 1/1984 | Hershel et al. |
| 4,676,631 A | 6/1987 | Kosugi et al. |
| 4,773,748 A | 9/1988 | Shih et al. |
| 4,964,705 A | 10/1990 | Markle |
| 5,031,977 A | 7/1991 | Gibson |
| 5,040,882 A | 8/1991 | Markle |
| 5,161,062 A | 11/1992 | Shafer et al. |
| 5,559,629 A | 9/1996 | Sheets et al. |
| 5,757,469 A | 5/1998 | Allen |
| 5,781,346 A | 7/1998 | Allen et al. |
| 5,805,356 A | 9/1998 | Chiba |
| 6,310,679 B1 | 10/2001 | Shiraishi |

(Continued)

FOREIGN PATENT DOCUMENTS

| JP | H10-289853 A | 10/1998 |
| JP | 2011-107264 A | 6/2011 |

OTHER PUBLICATIONS

Paul Klocek, Handbook of Infrared Optical Materials, 1991, Marcel Dekker, inc., p. 476.*

(Continued)

*Primary Examiner* — Scott J Sugarman
*Assistant Examiner* — Robert E Tallman
(74) *Attorney, Agent, or Firm* — Opticus IP Law PLLC

(57) ABSTRACT

A Wynn-Dyson imaging system with reduced thermal distortion is disclosed, wherein the reticle and wafer prisms are made of glass material having a coefficient of thermal expansion of no greater than about 100 ppb/° C. The system also includes a first IR-blocking window disposed between the reticle and the reticle prism, and a second matching window disposed between the wafer and the wafer prism to maintain imaging symmetry. The IR-blocking window substantially blocks convective and radiative heat from reaching the reticle prism, thereby reducing the amount of thermally induced image distortion in the reticle image formed on the wafer.

20 Claims, 5 Drawing Sheets

(56) References Cited

U.S. PATENT DOCUMENTS

| | | | |
|---|---|---|---|
| 6,341,006 B1* | 1/2002 | Murayama et al. | 355/53 |
| 6,522,386 B1 | 2/2003 | Nishi | |
| 6,560,000 B2 | 5/2003 | Iyer et al. | |
| 6,809,888 B1* | 10/2004 | Markle | 359/726 |
| 6,863,403 B2 | 3/2005 | Mercado et al. | |
| 6,879,383 B2 | 4/2005 | Mercado | |
| 7,116,496 B1 | 10/2006 | Mercado | |
| 7,148,953 B2 | 12/2006 | Mercado | |
| 2002/0154421 A1 | 10/2002 | Willden | |
| 2003/0235682 A1 | 12/2003 | Sogard | |
| 2013/0321935 A1* | 12/2013 | Stites | 359/728 |
| 2014/0126043 A1* | 5/2014 | Senekerimyan | 359/361 |

OTHER PUBLICATIONS

Search Report from Intellectual Property Office of Singapore (as conducted by Hungarian Intellectual Property Office) for Singapore Patent Application No. 2013086392, which is a counterpart to the above-identified US application.

Japanese Office Action for Japanese Application No. 2013/239824, which is a counterpart application to the above-identified US application.

* cited by examiner

WYNN-DYSON IMAGING SYSTEM WITH REDUCED THERMAL DISTORTION

FIELD

The present disclosure relates to Wynn-Dyson imaging systems, and in particular to a Wynn-Dyson imaging system with reduced thermal distortion.

The entire disclosure of any publication or patent document mentioned herein is incorporated by reference.

BACKGROUND

The Wynn Dyson imaging system has been used in the manufacture of semiconductor devices for approximately 30 years. The basic Wynn-Dyson imaging system has a reflective mirror and a refractive doublet located in the vicinity of the mirror focus.

One limitation of this fundamental design when used for photolithography is that a large reticle in the object plane would interfere with a large wafer residing in the image plane as the reticle image is "step and repeated" across the wafer to fully expose the entire wafer.

The basic Wynn-Dyson imaging system has thus been modified for use in photolithography by using prisms attached to the doublet assembly. The prisms serve to move the object and image planes into non-conflicting planes. Example Wynn-Dyson imaging systems as modified for use in photolithography are disclosed in U.S. Pat. Nos. 6,863,403, 7,116,496, 6,813,098, and 7,148,953.

FIG. 1 shows a prior art Wynn-Dyson imaging system 8. The Wynn-Dyson imaging system 8 has a concave mirror 10 disposed along an optical axis 14. Mirror 10 has an aperture stop AS that serves to define a numerical aperture (NA) for the system. A lens system 13 is arranged along optical axis 14 and is spaced apart from mirror 10. The lens system 13 has a front end 13F that faces mirror 10, and a rear end 13R that faces away from mirror 10. The lens system 13 includes a meniscus lens 13A at the front end 13F of the lens system, and a plano-convex lens 13B at the rear end of the lens system.

Wynn-Dyson imaging system 8 also includes two prisms 17 and 19 that define a prism assembly. Prisms 17 and 19 are each arranged on opposite sides of optical axis 14, with one of their surfaces in intimate contact with respective portions of the planar surface of plano-convex lens 13B, which defines the rear end 13R of the lens assembly 13. A reticle 16 resides in an object plane OP and a wafer 18 resides in an image plane IP. Prism 17 resides adjacent reticle 16 while prism 19 resides adjacent wafer 18.

A typical photolithography reticle 16 has transmissive regions and opaque regions. The opaque regions are typically made of chrome, which reflects approximately 70% of the UV light 11 incident thereon, and absorbs the remaining 30%. The transmissive regions are clear and transmit UV light 11 with little absorption. For reticles that are 50% transparent, approximately 15% of the total UV light incident thereon is absorbed by the reticle. In a typical photolithography system, the power level of the UV light 11 incident on reticle 16 is about 2 watts/cm$^2$, which implies that approximately 300 mw/cm$^2$ of light is absorbed by the reticle. In some conditions, a reticle might be only 10% transmissive, in which case, approximately 540 mw/cm$^2$ of light is absorbed by the reticle. This is sufficient to cause heating, and subsequently, mechanical distortion in the reticle.

The UV light 11 from the illuminator (not shown in FIG. 1) that is absorbed by the reticle 16 heats the reticle, which is in close proximity to prism 17. Measurements by the inventors have shown that, in some cases, reticle 16 can heat to up to 50° C. when irradiated by UV light 11. This heating causes two main problems. The first is that the reticle itself distorts. The amount of reticle distortion depends upon the type of glass used for the reticle. However, typical values for the coefficient of thermal expansion (CTE) for common reticle materials such as quartz is about 1 part per million (ppm) per ° C. Hence, a 30° temperature rise can distort the reticle by approximately 30 ppm. For a 36 mm long image field at the wafer, this distortion is calculated as $(36 \text{ mm}/2) \cdot 30 \times 10^{-6} = 0.5$ microns. Depending upon the lithography and overlay requirements, this may be highly problematic.

The second main problem is that the heat from the reticle is transferred to the adjacent prism 17. It has been observed by the inventors that this heat transfer can cause prism 17 to bend, which leads to an asymmetric image distortion at the wafer (i.e., the reticle image is distorted).

FIG. 2 is a close-up schematic diagram of reticle 16 and the adjacent prism 17 according to the prior art configuration of FIG. 1. Prism 17 has a proximal surface 17a and a corner or tip 17c. As the reticle 16 heats up, it heats the adjacent prism 17 by convective heating and by radiative transfer of heat (the reticle emits heat in the infrared, e.g., around 10 microns in wavelength). The convective heat or convective heating is represented in FIG. 2 by dashed lines and denoted 20C, while the radiative heat or radiative heating is represented by arrows and denoted 20R. The overall heating is denoted as 20. The tip 17c of the prism 17 heats up more than its base and so bends. This bending causes the image of the reticle 16 at the wafer 18 to shift in one direction, which is to say that the reticle image suffers from thermally induced distortion.

Prism bending changes the distortion (or magnification) in the "y" direction (i.e., creates a "Y-mag" change). Under some conditions (e.g., where the reticle is 95% chrome, and hence, absorbs approximately 600 mw/cm$^2$), the steady-state Y-mag change can be over 50 ppm, thereby leading to over 1 micron of image distortion at the wafer (image) plane. This directly leads to a 1 micron overlay error.

Generally, it is required that the overlay accuracy of a photolithography system be approximately 25% of the linewidth being printed. A 1 micron overlay error implies that the smallest feature that the photolithography system can be used to manufacture would be about 4 microns, independent of the resolution of the system. Hence, even if the photolithography system has a resolution of 1 micron, it cannot be used in manufacturing for features smaller than 4 microns.

Prior attempts to solve the problem of thermal distortion of the prism include flowing cool air between the reticle and the prism. Unfortunately, the time-dependent nature of the prism heating renders this approach unsatisfactory. When the photolithography system is sitting idle for more than a few minutes, the prism 17 returns to its base temperature. When the photolithography system is then operated, the prism 17 begins to heat up. The temperature of the prism 17 increases with increasing number of wafers 18 processed.

However, after only one wafer being processed, the reticle temperature typically increases by only a few ° C., while after 10 wafers, it typically increases by 20° C. to 30° C. Therefore, the reticle temperature (and hence, the prism temperature) is time dependent. Unfortunately, air cooling usually ends up overcooling the reticle initially during the first few wafers and then does not adequately cool the reticle for larger numbers of wafers (e.g., 10 or more). In other words, the time dependency of air cooling is too slow relative to the heating profile of the photolithograph system to make air cooling an effective solution for reducing thermally induced distortion. Furthermore,

SUMMARY

An aspect of the disclosure is a Wynn-Dyson imaging system that operates with light having a UV wavelength, comprising along an optical axis: a mirror having a concave surface; an aperture stop located at the mirror that determines a numerical aperture (NA) of the system; a lens assembly with positive refracting power and having a front end and a back end, with lens assembly being arranged adjacent the mirror and spaced apart therefrom with the front end facing the mirror; first and second prisms operably disposed on opposite sides of the optical axis and adjacent the back end of the lens assembly, the first and second prisms having respective first and second planar surfaces, wherein the first and second planar surfaces are arranged adjacent object and image planes, respectively. The system also includes at least one of: a) the first and second prisms each being made of a glass material having a coefficient of thermal expansion of no greater than about 100 ppb/° C.; and b) a first window operably disposed between the planar surface of the first prism and the object plane and that substantially transmits the UV light and that substantially blocks infrared (IR) radiation in a wavelength range from 2 microns to 20 microns, and a second window operably disposed between the planar surface of the second prism and the image plane, wherein the second window substantially transmits the UV light, and wherein the first and second windows are configured to maintain imaging symmetry.

Another aspect of the disclosure is a method of reducing image distortion in a Wynn-Dyson imaging system used to image a reticle onto a wafer using a UV wavelength. The method includes disposing a first window between the reticle and an adjacent reticle prism, wherein the first window is configured to substantially IR light having a wavelength between 2 microns and 20 microns and to substantially transmit the UV light. The method also includes disposing a second window between the wafer and an adjacent wafer prism, wherein the second window substantially transmits UV light. The method also includes irradiating the reticle with the UV light to form an image of the reticle on a wafer using the Wynn-Dyson imaging system. The UV light heats the reticle to at least 50° C., thereby causing the reticle to emit convective heat and radiative heat. The method further includes blocking with the first window a substation portion of the convective heat and the radiative heat so that the image of the reticle on the wafer has reduced image distortion as compared with not using the first IR-blocking window and the second window.

Another aspect of the disclosure is a method of reducing image distortion in a Wynn-Dyson imaging system having a primary mirror and an optical assembly and used to image a reticle onto a wafer using light having a UV wavelength. The method includes providing the optical assembly with reticle and wafer prisms made from an ultra-low expansion (ULE®) glass material. The method also includes irradiating the reticle with the UV light to form an image of the reticle on a wafer using the Wynn-Dyson imaging system. The UV light heats the reticle to at least 50° C., thereby causing the reticle to emit convective heat and radiative heat. The method further includes the image of the reticle on the wafer having a maximum image distortion of no greater than 0.5 microns.

Additional features and advantages will be set forth in the Detailed Description that follows and in part will be readily apparent to those skilled in the art from the description or recognized by practicing the embodiments as described in the written description and claims thereof, as well as the appended drawings. It is to be understood that both the foregoing general description and the following Detailed Description are merely exemplary and are intesnded to provide an overview or framework for understanding the nature and character of the claims.

BRIEF DESCRIPTION OF THE DRAWINGS

The accompanying drawings are included to provide a further understanding and are incorporated in and constitute a part of this specification. The drawings illustrate one or more embodiment(s) and together with the Detailed Description serve to explain principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute a part of this Detailed Description.

Cartesian coordinates are shown in some of the Figures for the sake of reference and are not intended to be limiting as to direction or orientation.

Figure 1:
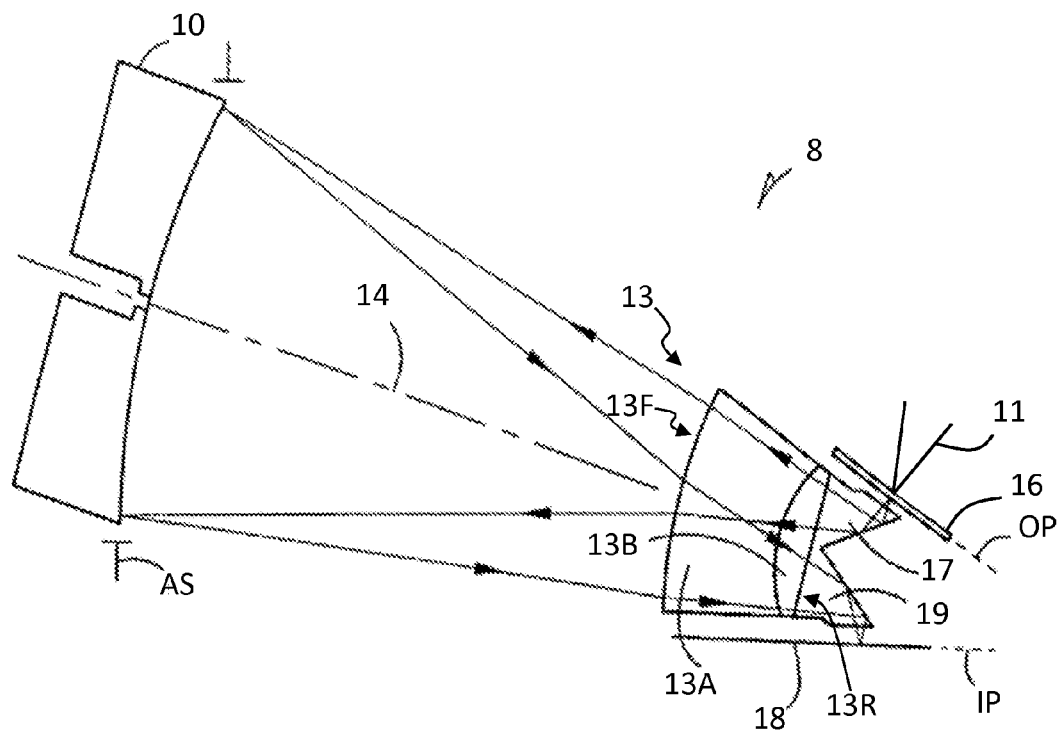
FIG. 1 is a schematic diagram of an example prior art Wynn-Dyson imaging system for use in photolithography.
Figure 2:
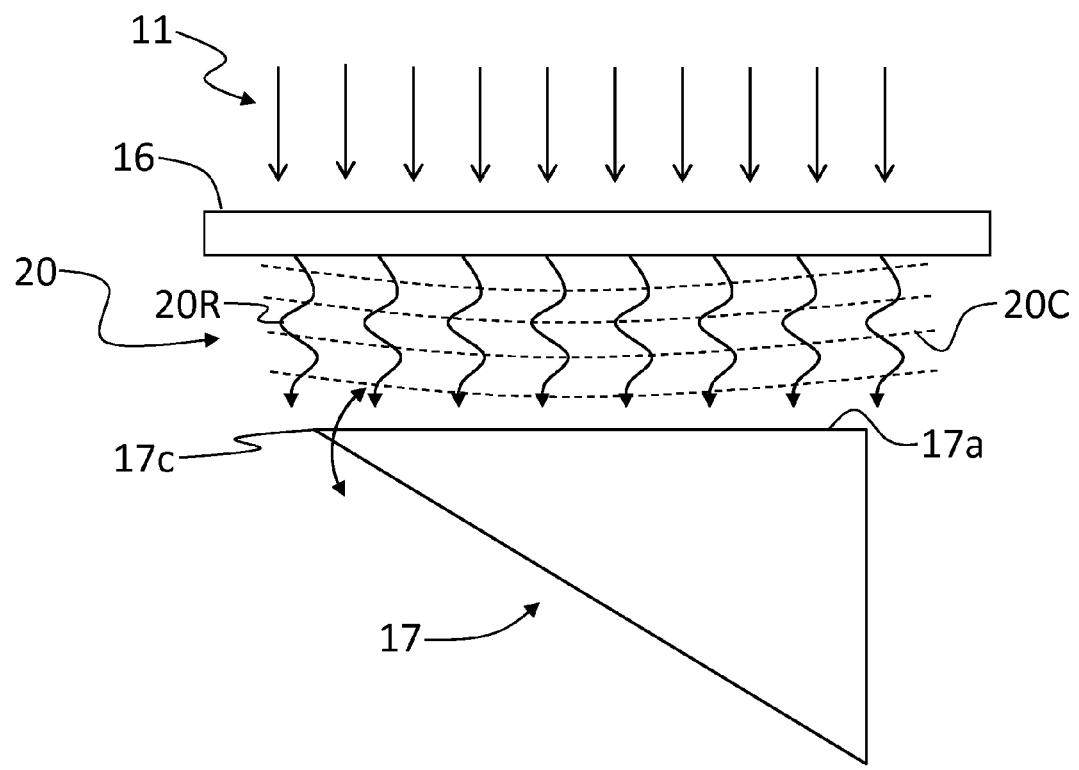
FIG. 2 is a close-up view of the reticle and adjacent prism of the prior art Wynn-Dyson imaging system of FIG. 1, showing how heat from a heated reticle can heat the adjacent prism, causing the corner of the prism to bend, thereby leading to optical distortion at the image plane.
Figure 3:
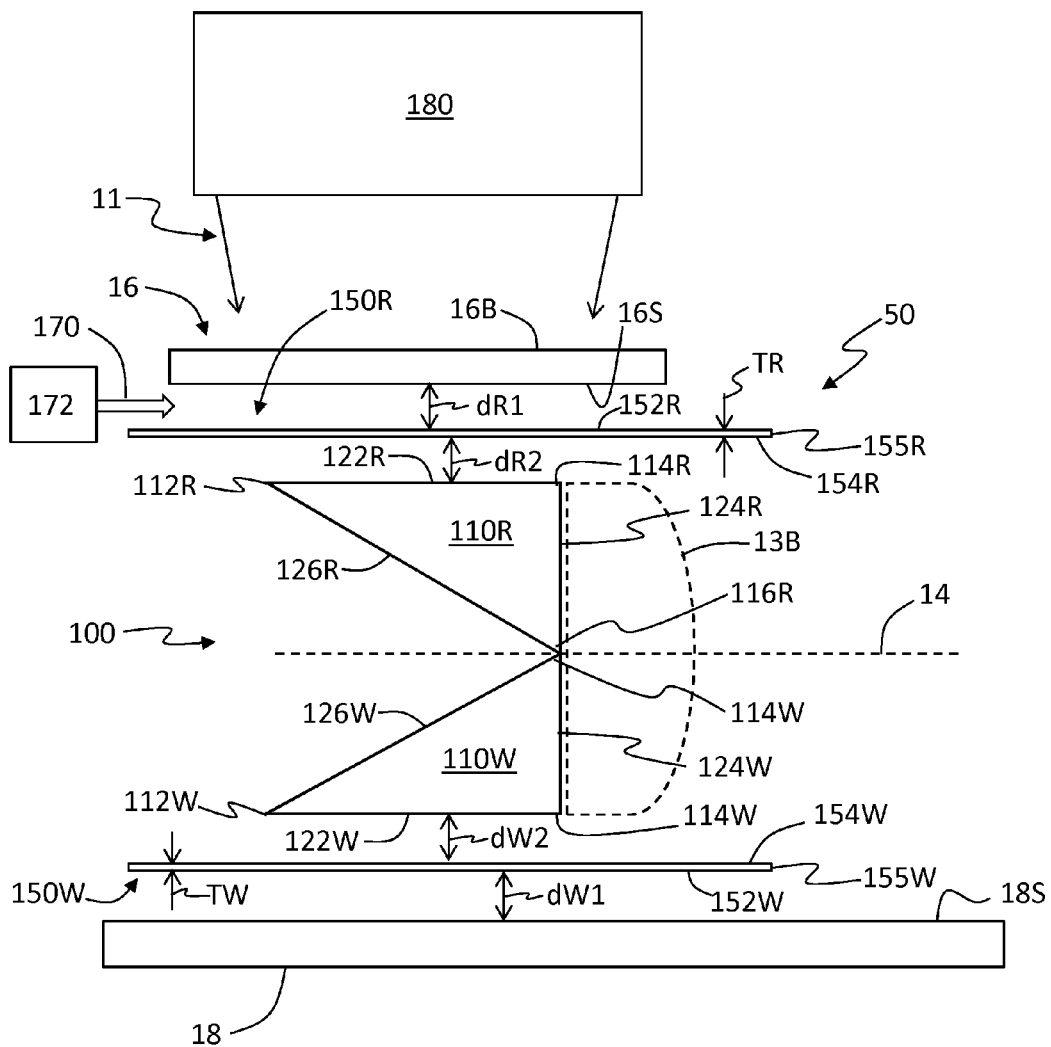
FIG. 3 is a close-up view of an optical assembly suitable for forming a modified Wynn-Dyson imaging system, wherein the optical assembly includes first and second windows respectively arranged adjacent the reticle and wafer prisms of a prism assembly, wherein the first window is an IR-blocking window.
Figure 4:
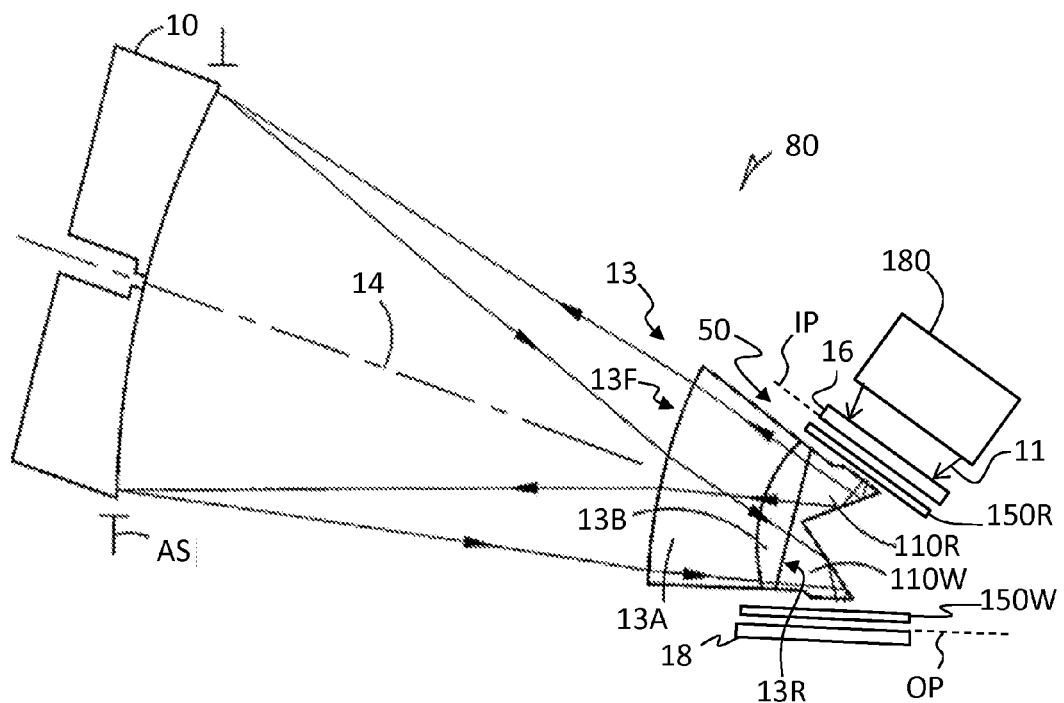
FIG. 4 is a schematic diagram of a modified Wynn-Dyson imaging system that includes the optical assembly of FIG. 3.

FIG. 3 is a close-up view an example optical assembly 50 for use with a Wynn-Dyson imaging system such as shown in FIG. 1 to form a modified Wynn-Dyson imaging system. An example modified Wynn-Dyson imaging system 80 is shown in FIG. 4. Reticle 16 has a front surface 16S and a back surface 16B, and wafer 18 has a surface 18S. Optical assembly 50 includes a prism assembly 100 that consists of prisms 110R and 110W, with prism 110R being closest to reticle 16 and prism 110W being closest to wafer 18. Prism 110R is thus referred to here as "reticle prism" 110R, while prism 110W is referred to herein as "wafer prism" 110W.

Reticle prism 110R includes three corners 112R, 114R and 116R, and three surfaces 122R, 124R and 126R, with prism surface 122R facing reticle 16. Likewise, wafer prism 110W includes three corners 112W, 114W and 116W, and three surfaces 122W, 124W and 126W, with prism surface 122W facing wafer 18. Reticle and wafer prisms 110R and 110W are arranged so that their vertices 116R are either in close proximity or are in contact. Reticle and wafer prism surfaces 124R and 124W can be in close proximity to or in contact with a planar surface 13BP of plano-convex lens element 13B, which is shown in dashed line outline in FIG. 3.

FIG. 3 also shows an illumination system 180 adjacent the back surface 16B of reticle 16 and that serves to illuminate the reticle with UV light 11, which also acts to heat the reticle as described above.

A requirement for a Wynn-Dyson imaging system is that the reticle and wafer prisms 110R and 110W be made out of a high index of refraction glass that is optically transparent at the photolithography system's operating wavelength (e.g., 365 nm). The required index of refraction depends upon the desired NA of the Wynn-Dyson imaging system. However, for many Wynn-Dyson imaging system configurations, an index of refraction greater than about 1.4 is needed. Thus, in an example embodiment of optical assembly 50, reticle and wafer prisms 110R and 110W are made of a glass that has: a) a very low coefficient of thermal expansion (CTE) (i.e., an "ultra-low thermal expansion" or ULTE), e.g., no greater than $1 \times 10^{-7}/°$ C. in the temperature range from 5° C. to 35° C., i.e., no more than 100 ppb/° C.; and b) suitable refractive index at ultraviolet wavelengths used in photolithography (e.g., 365 nm).

An example of a ULTE glass is one made of titanium silicate, such as the Ultra-Low Expansion (ULE)® 7292 titanium-silicate glass, available from Corning, Inc., Corning, N.Y. The ULE® glass from Corning is sufficiently optically transparent at the relevant UV wavelengths while also having an appropriate index of refraction for use as the reticle and wafer prisms 110R and 110W for a Wynn-Dyson imaging system. ULE® glass has a CTE of about +/−30 ppb/° C. from 5° C. to 35° C.

IR-Blocking Window

In an example embodiment, optical assembly 50 also includes a first window 150R disposed between reticle 16 and reticle prism 110R. Optical assembly 50 also includes a second window 150W is disposed between wafer 18 and wafer prism 110W so that the imaging symmetry is maintained. That is to say, because the optical path from the object plane OP to the image plane IP is generally symmetrical about optical axis 14, the second window 150W is configured to compensate for any imaging aberrations (e.g., spherical aberration) caused by the introduction of the first window 150R. First and second windows 150R and 150W need to have good optical transmission at UV wavelengths used in photolithography. First and second windows 150R and 150W have respective thicknesses TR and TW. One straightforward way to maintain imaging symmetry is to make the first and second windows out of the same material and of the same thickness.

In an example, at least first window 150R blocks IR wavelengths between 2 microns and 20 microns and so is referred to hereinafter as IR-blocking window 150R. Also in an example, second window 150W is substantially the same as IR-blocking window 150R, which is the easiest way to maintain imaging symmetry. However, second window need not be an IR-blocking window and so may be made of a different material than IR-blocking window 150R. In that case, second window 150W may need to have a different refractive index and thus a different thickness TW than the thickness TR of IR-blocking window 150R to preserve imaging symmetry.

In an example, IR-blocking window 150 is made of sapphire. Sapphire transmits light from the UV wavelength range where most photolithography systems operate (e.g., 365 nm) up to about 5 microns, and substantially absorbs radiation above 5 microns. Heated reticle 16 generates radiative heat 20R due to black-body radiation that peaks at about 10 microns. Hence, much of the black body radiation (i.e., radiative heat 20R) from heated reticle 16 will be absorbed by IR-blocking window 150R and will not substantially heat the adjacent reticle prism 110R.

Figure 5A:
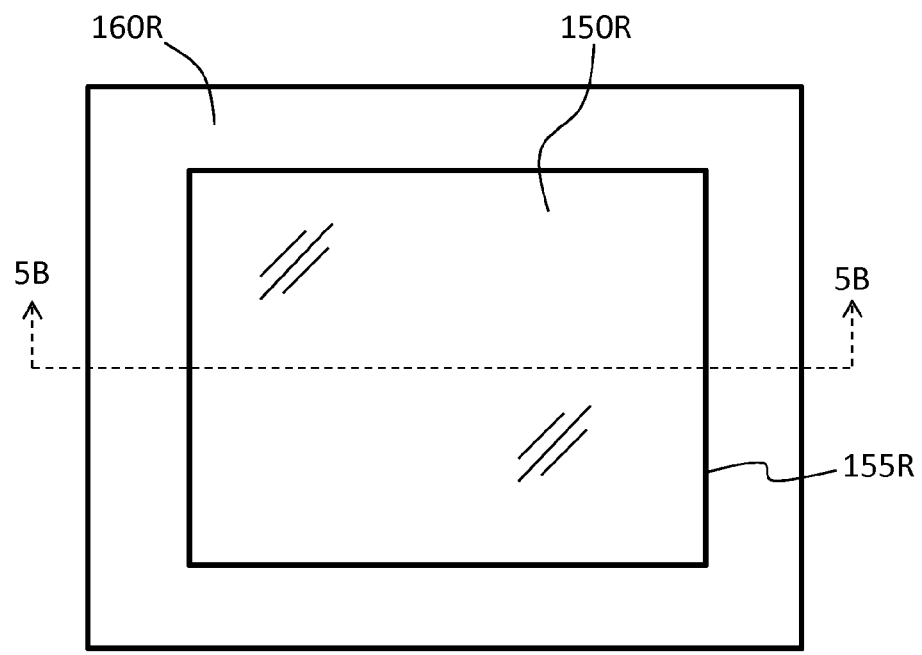
FIG. 5A is a plan view of an example IR-blocking window mounted in a heat-sink mount at the outer edge of the IR-blocking window to remove heat from the IR-blocking window.
Figure 5B:
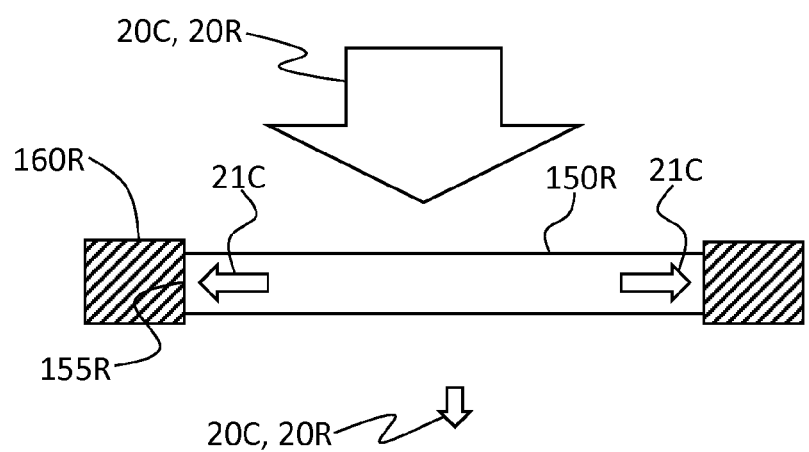
FIG. 5B is a cross-sectional view of the IR-blocking window and heat-sink mount of FIG. 5A as taken along the line 5B-5B.

Sapphire is also highly thermally conductive. Hence, in an example embodiment illustrated in the close-up views of FIGS. 5A and 5B, IR-blocking window 150R can be thermally connected to a heat sink at its outer edges 155 to convectively remove the heat absorbed by IR-blocking window. FIGS. 5A and 5B show IR-blocking window 150R operably supported at its outer edge 155R by a heat-sink mount 160R. In an example, heat-sink mount 160R is made of a thermally conductive material such as copper, stainless steel, etc. The convective and radiative heat 20C and 20R are shown heating the IR-blocking window 150R. Only a small portion of this heat makes it through the IR-blocking window 150R. The convective and radiative heat 20C and 20R combines to form heat in the IR-blocking window 150R, and most of this heat is convectively removed (as convective heat 21C) through heat-sink mount 160R.

Because sapphire is more thermally conductive than glass, air flowing on the IR-blocking window 150R will be more effective in further removing convective heat 20C than prior art Wynn Dyson imaging systems. The thermal time constant for sapphire is faster; that is, a IR-window with relatively higher thermal conductivity (such as sapphire relative to fused silica) will cool much more quickly. This improves the temporal response of an air cooled system. FIG. 3 illustrates the flow of air 170 between IR-blocking window 150R and reticle 16. The flow of air 170 is shown as originating from an air supply 172. The flow of air 170, in combination with the heat-sink mount 160R (see FIGS. 5A, 5B) can effectively remove any heat 20 transferred from heated reticle 16 to IR-blocking window 150R. The IR-blocking window 150R will also remain cooler than reticle 16. As a result, the IR-blocking window 150R will not substantially heat reticle prism 110R. Thus, IR-blocking window 150R substantially eliminates the heating of reticle prism 110R from convective heat 20C and radiative heat 20R by providing a barrier between the heated reticle 16 and reticle prism 110R to both of these types of heating.

Sapphire is a birefringent material. Consequently, it is advantageous that when the first window 150R is made of sapphire, the second window 150W is also made of sapphire and has thickness TW=TR. Moreover, first and second sapphire windows 150R and 150W are best disposed in optical assembly 50 (e.g., are "clocked" relative to one another) so that the "e" and "o" axes of these windows are at nominally 90° relative to each other (as measured relative to the optical path of light traveling through the system). This arrangement will substantially or completely cancel out a potentially adverse imaging effect caused by the birefringence.

In an example, thicknesses TR and TW are in the range 0.05 to 2 mm. In the example where IR-blocking window 150R is made of sapphire so that window 150W is also made of sapphire, the thicknesses TR and TW of the two IR-blocking windows 150R and 150W need to be sufficiently close to each other so that the resulting birefringence (from any thickness difference) is negligible. The approximate index of refraction difference between the "e" and "o" axes for sapphire at 365 nm is roughly 0.008. To maintain an image wavefront quality better than λ/8, the thickness difference ΔT between the two IR-blocking windows needs to be less than 5.6 microns. This limitation can be increased to 11 microns for conditions where the wavefront accuracy requirement is only λ/4. The lateral dimensions of the IR-blocking windows are sufficiently large so that they allow light to pass from the entire object and image plane.

In an example, IR-blocking window 150R is in the form of a thin planar sheet having opposite surfaces 152R and 154R, an outer edge 155R and a thickness TR. Likewise, IR-blocking window 150W is in the form of a thin planar sheet having opposite surfaces 152W and 154W, an outer edge 155W and a thickness TW=TR. IR-blocking window 150R is spaced apart from reticle 16 by a distance dR1 and from the surface 122R of reticle prism 110R by a distance dR2. Likewise, IR-blocking window 150W is spaced apart from reticle 16 by a distance dW1 and from the surface 122W of wafer prism 110W by a distance dW2. In an example, distance dR1 and dw1 are equal and can be any value between 1 and 5 mm. Similarly, dR2 and dW2 are equal and can be any value between 1 and 5 mm.

It is noted that one example of optical assembly 50 includes IR blocking 150R, window 150W, and conventional reticle and wafer prisms. Another example of optical assembly 50 includes the ULTE prisms 110R and 110W but not windows 150R and 150W. In another example embodiment, optical assembly 50 includes both the ULTE prisms 110R and 110W and windows 150R and 150W.

Second window 150W can also serve the purpose of reducing or preventing contamination of optical assembly 50. In photolithography, the wafer 18 at the image plane IP is coated with a photo sensitive material called photoresist (not shown). The photoresist, when exposed to UV radiation, often outgases. The outgassed vapor can condense on the nearest optical element to the wafer, which in a conventional Wynn-Dyson imaging system 8, is the wafer prism 19 (see FIG. 1). Unfortunately, the wafer prism 19 is not an easily replaceable component. Any contaminants condensing on the wafer prism 19 will need to be periodically cleaned with solvents. However, many of the contaminants are not soluble in solvents after the contaminants have been exposed to subsequent UV radiation. Over time, the condensed contaminants form a thin, non-uniform but absorbing layer on the surface of wafer prism 19 closest to wafer 18. This contamination can degrade imaging performance.

In the modified Wynn-Dyson imaging system 80 of FIG. 4, second window 150W disposed between wafer 18 and the surface 122W of wafer prism 110W can be designed as a more readily replaceable element than the wafer prism 110W. Thus, when contaminants collect on second window 150W, the second window can be removed from optical assembly 50 and cleaned or replaced with a clean window.

The use of windows 150R and 150W In the modified Wynn-Dyson imaging system 80 may require reticle and wafer prisms 110R and 110W to be made thinner than prior art prisms used in Wynn-Dyson imaging systems to accommodate the windows. However, the impact on optical performance of the Wynn-Dyson imaging system due to use of thinner prisms 110R and 110W can be readily minimized and otherwise made acceptable for photolithographic applications by employing standard optical design optimization techniques.

In an example, even with IR-blocking window 150R, reticle prism 110R may still be heated to some extent, though substantially less than prior art systems that have no IR-blocking window. However, by also using a ULTE reticle prism 110R, the residual heat imparted to the reticle prism (see FIG. 5B) will not cause the prism to substantially deform. This in turn means that thermally induced optical distortion can be substantially reduced or eliminated.

The amount of thermally induced optical distortion in prior art Wynn-Dyson imaging systems used in photolithography can easily exceed 1 micron. The modified Wynn-Dyson imaging system 80 as disclosed herein and that employs the various embodiments of optical assembly 50 as described above has less thermal distortion than prior art Wynn-Dyson imaging systems used for photolithography. In an example, the maximum amount of image distortion in the Wynn-Dyson imaging system disclosed herein is no greater than 0.5 microns, and in another example is no greater than 0.25 microns.

In an example, the amount of image distortion is reduced by at least a factor of 2× as compared to a conventional Wynn-Dyson imaging system used for photolithography. In another an example, the amount of image distortion is reduced by at least a factor of 5× as compared to the conventional Wynn-Dyson imaging system used for photolithography. In another an example, the amount of image distortion is reduced by at least a factor of 10× as compared to the conventional Wynn-Dyson imaging system used for photolithography.

In an example embodiment of the modified Wynn-Dyson imaging system 80 disclosed herein, the thermal load on the reticle prism 110R is reduced by over half due to the IR-blocking window 150. That is to say, IR-blocking window 150R blocks over half of the black body radiation from the heated reticle 16.

In addition, the example sapphire IR-blocking window 150R has a ten times greater CTE than conventional glasses and so is cooled much more effectively. A sapphire IR-blocking window 150R thus substantially eliminates the heating of reticle prism 110R due to convective heat 20C and radiative heat 20R from heated reticle 16. Furthermore, the CTE of the ULTE reticle and wafer prisms 110R and 110W is about ten times lower than the CTE of the glass materials that are usually used for the reticle and wafer prisms 17 and 19 in conventional Wynn-Dyson imaging system 8.

Consequently, the amount of image distortion at the image plane is reduced substantially to the imaging limitations imposed by manufacturing errors, primarily in the surface flatness of the reticle and wafer prism surfaces 126R and 126W, which serve as total-internal reflection (TIR) surfaces. The surface flatness variation for these surfaces is typically less than 250 nm.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A Wynn-Dyson imaging system used to image a reticle onto a wafer by illumination of the reticle with light having an ultraviolet (UV) wavelength that is absorbed by and that heats the reticle, comprising along an optical axis:
   a mirror having a concave surface;
   an aperture stop located at the mirror that determines a numerical aperture of the system;
   a lens assembly with positive refracting power and having a front end and a back end, with the lens assembly being arranged adjacent the mirror and spaced apart therefrom with the front end facing the mirror;

first and second prisms operably disposed on opposite sides of the optical axis and adjacent the back end of the lens assembly, the first and second prisms having respective first and second planar surfaces, wherein the first and second planar surfaces are arranged adjacent object and image planes, respectively, at which the reticle and wafer respectively reside; and a first window operably disposed between the planar surface of the first prism and the object plane and that is made of sapphire and that substantially absorbs and carries away infrared (IR) radiation and convective heat emitted by the heated reticle in order to prevent the IR radiation and convective heat from reaching and substantially heating the first prism, and a second window that is operably disposed between the planar surface of the second prism and the image plane and that substantially transmits the UV light, wherein the first and second windows are configured to maintain imaging symmetry.

2. The Wynn-Dyson imaging system of claim 1, further including an air supply unit arranged to flow air between the image plane and the first IR-blocking window.

3. The Wynn-Dyson imaging system of claim 1, wherein the first and second windows each have a thickness of between 0.05 and 2 mm.

4. The Wynn-Dyson imaging system of claim 1, further comprising:
   the reticle, wherein the reticle has a front side and a back side;
   the wafer; and
   an illumination system arranged adjacent the back side of the reticle and configured to perform the illumination of the reticle with the UV light, wherein the reticle image has an amount of optical distortion that is no greater than 0.25 microns.

5. The Wynn-Dyson imaging system of claim 1, further comprising the first window mounted in a heat-sink mount configured to assist in the carrying away the absorbed IR radiation and convective heat from the first window.

6. The Wynn-Dyson imaging system of claim 5, wherein the first window has an outer edge, and wherein the heat-sink mount is in thermal contact with the outer edge of the first window.

7. The Wynn-Dyson imaging system of claim 1, wherein the reticle and wafer prisms are made of a glass material having an ultra-low coefficient of thermal expansion of no greater than 100 ppb/° C.

8. A method of reducing image distortion in a Wynn-Dyson imaging system used to image a reticle onto a wafer using an ultraviolet (UV) wavelength, comprising:
   disposing a first window between the reticle and an adjacent reticle prism, wherein the first window is made of sapphire;
   disposing a second window between the wafer and an adjacent wafer prism, wherein the second window substantially transmits UV light;
   irradiating the reticle with the UV light to form an image of the reticle on the wafer using the Wynn-Dyson imaging system, with the UV light heating the reticle to at least 50° C., thereby causing the reticle to emit convective heat and radiative heat;
   absorbing and carrying away with the first window a substantial portion of the convective heat and the radiative heat to prevent substantial heating of the adjacent reticle prism so that the image of the reticle on the wafer has reduced image distortion as compared with not using the first IR-blocking window and the second window.

9. The method of claim 8, wherein the reticle and wafer prisms are made from an ultra-low expansion glass material.

10. The method of claim 8, wherein the first and second windows each have a birefringence and are configured relative to one another to substantially cancel an imaging effect due to the birefringence.

11. The method of claim 8, further comprising flowing air between the reticle and the first IR-blocking window to remove heat from both the reticle and the sapphire first window.

12. The method of claim 8, further comprising mounting the first window in a heat-sink mount configured to assist in the carrying away of the radiative and convective heat absorbed by the first window.

13. The method of claim 12, wherein the first window has an outer edge, and thermally contacting the heat-sink mount with the outer edge of the first window.

14. A method of reducing image distortion in a Wynn-Dyson imaging system having a primary mirror and an optical assembly and used to image a reticle onto a wafer using an ultraviolet (UV) wavelength, comprising:
   providing the optical assembly with reticle and wafer prisms made from a titanium-silicate glass material;
   irradiating the reticle with the UV light to form an image of the reticle on the wafer using the Wynn-Dyson imaging system, with the UV light heating the reticle to at least 50° C., thereby causing the reticle to emit convective heat and radiative heat towards a reticle prism;
   substantially preventing the convective heat and radiative heat from reaching the reticle prism by absorbing and carrying away the convective and radiative heat with a sapphire window operably disposed between the reticle and reticle prism; and
   wherein the image of the reticle on the wafer has a maximum image distortion of no greater than 0.5 microns.

15. The method of claim 14, further comprising:
   disposing a second window between the wafer and an adjacent wafer prism, wherein the second window substantially transmits UV light.

16. The method of claim 14, wherein the wherein the image of the reticle on the wafer has a maximum image distortion of no greater than 0.25 microns.

17. The method of claim 15, wherein the second window is made of sapphire.

18. The method of claim 17, wherein the first and second sapphire windows each have birefringence and are clocked relative to one another to reduce an imaging effect due to the birefringence.

19. The Wynn-Dyson imaging system of claim 7, wherein the glass material is a titanium silicate glass.

20. The Wynn-Dyson imaging system of claim 9, wherein the glass material is a titanium silicate glass.

* * * * *